United States Patent [19]

Love et al.

[11] Patent Number: 4,870,561
[45] Date of Patent: Sep. 26, 1989

[54] USER INTERFACE SIMULATION AND MANAGEMENT FOR PROGRAM-CONTROLLED APPARATUS

[75] Inventors: Simon Love, Bristol; Elizabeth M. C. Boswell, Chippenham; Roger J. Quy, Bristol, all of Great Britain

[73] Assignee: Hewlett-Packard Company, Palo Alto, Calif.

[21] Appl. No.: 84,952

[22] Filed: Jul. 20, 1987

[30] Foreign Application Priority Data

Sep. 1, 1986 [GB] United Kingdom ............... 8621061

[51] Int. Cl.⁴ ..................... G06F 9/44; G06F 15/60
[52] U.S. Cl. ........................ 364/192; 364/190; 364/200; 364/221.2; 364/222; 364/251.6; 364/264.3; 364/275.6
[58] Field of Search ... 364/200 MS File, 900 MS File, 364/578, 188, 189, 192, 194, 512, 521, 200, 900, 146, 190; 371/23, 24, 29

[56] References Cited

U.S. PATENT DOCUMENTS

| 4,512,747 | 4/1985 | Hitchens et al. | 434/428 |
| 4,613,949 | 8/1986 | Forman | 364/518 |
| 4,635,208 | 1/1987 | Coleby et al. | 364/491 |
| 4,679,137 | 7/1987 | Lane et al. | 364/188 |
| 4,727,473 | 2/1988 | Anderson et al. | 364/188 |

OTHER PUBLICATIONS

IEEE Transactions on Software Engineering, vol. SE-12, No. 1, Jan. 1986, pp. 147-156, New York, A. I. Wasserman et al., "Bulding Reliable Interactive Information".
IBM Journal of Research and Development, vol. 29, No. 4, Jul. 1985, pp. 343-354, New York, H. Engelke et al., "Integrated Manufacturing Modeling System".
Proceedings of the IEEE 1985 National Aerospace and Electronics Conference Naecon 1985, May 1985, vol. 1, pp. 826-833, New York, W. Cooper, "Using SAINT in Performance Analysis of Complex Hardware/Software Systems".
IEEE Transactions on Software Engineering, vol. SE-12, No. 2, Feb. 1986, pp. 326-345, New York, A. I. Wasserman et al., "Developing Interactive Information Systems with the User Software Engineering Methodology".
Computer, vol. 18, No. 8, Aug. 1985, pp. 87-94, New York, B. Melamed et al., "Visual Simulation: The Performance Analysis Workstation".
Navy Technical Disclosure Bulletin, vol. 8, No. 1, Sep. 1982, pp. 77-80, Washington, K. Lindenberg et al., "Simulated Test Equipment".

*Primary Examiner*—Jerry Smith
*Assistant Examiner*—James J. Kulbaski

[57] ABSTRACT

An interactive graphical tool is provided for designing the user interface of a program-controlled instrument. The tool runs on a computer workstation and is used to model the application code of the instrument as a first network in which sessions of user interaction with the application code are represented by respective elements of the network. The actual user interaction sessions themselves are modelled by respective second networks; each second network includes information for defining the interface states of the modelled user interaction session. The full user interface can thereafter be simulated by progressing through the first model until a user interaction element is met and then entering the corresponding second network; the interface state information contained in the second network is used to drive a simulation of the instrument interfaace on the display of the computer workstation. The separation of the modelling of the application code from that of the user interaction sessions facilitates modification of the interface simulation.

15 Claims, 8 Drawing Sheets

USER INTERFACE SIMULATION AND MANAGEMENT FOR PROGRAM-CONTROLLED APPARATUS

The present invention relates to the simulation and management of the user interface of a program-controlled apparatus and, in particular, but not exclusively, to an interactive graphical tool for designing user interfaces on a computer workstation.

Any interactive system, such as many modern-day instruments, can be seen as having two components, namely a user interface and the system-executed, or application, tasks. In the past, the system functioning required to execute the application tasks has been the focus of product development with interface design being secondary. With the increasing complexity of interactive systems, it has been recognised that the design of the user interface is at least as important as that of the underlying functionality of the system and, indeed, in commercial terms, possibly more important.

Considerable efforts have therefore been made recently to develop suitable tools for user interface design and evaluation. One approach adopted has been to use augmented state transition networks to model the functioning of the interface. Thus, Wasserman has developed a methodology for interface design, known as the USE methodology, that incorporates both user-interaction actions and apparatus-executed tasks in a single transition network with the provision for sub-networks (see "The Role of Prototypes in the User Software Methodology", Wasserman and Shewmake; published in "Advances in Human Computer Interaction", Ablex Publishing Co., 1984). Similarly, Alty has developed an interface modelling system, known as the CONNECT system, which is based upon a combination of a transition network and a production rule system (see "The Application of Path Algebras to Interactive Dialogue Design" published in Behaviour and Information Technology, 1984, Vol. 3, No. 2).

It is an object of the present invention to provide an interface design tool which facilitates the creation and modification of user-interface models and the generation of interface simulations.

SUMMARY OF THE INVENTION

According to one aspect of the present invention, there is provided a method of simulating, on a computer, a user interface for a program-controlled apparatus arranged to operate in accordance with a program that includes both apparatus-executed tasks and sessions of user interaction intended to be effected via input and output means of said apparatus, said method comprising the steps of:

generating and storing a first or application network model representing said program with each session of user interaction being indicated by a corresponding element of said first model;

generating and storing a set of second or dialogue network models each representing a respective one of said interaction sessions, each second network model comprising a network of elements each having an associated set of parameters defining a simulation of a desired state of said output means, running a simulation of the user interface by advancing through said first network model and upon encountering a said user-interaction element, entering and following through the appropriate one of said second network models, the said set of parameters associated with each said network model being used to construct, on output means of the computer, a simulation of the desired state of the output means of said apparatus.

By separating out the user-interaction sessions into respective network models, modification of the interface design is greatly facilitated.

Preferably, during passage through a said second model while running a simulation of the interface, the output means of the computer is used to display simultaneously both the second model and the simulation of the current state of the output means of said apparatus.

Generally, a number of different possible paths will exist through each second network. To provide for this situation during running of the simulation, the step of interface simulation advantageously includes, during passage through a multiple-path second network model, the determination of the path to be followed through the model by operator input to the computer to indicate the path desired. This user input may indicate the desired path directly by reference to the second model. Alternatively, the user input may simulate a possible input of the interface under design, this input being then compared against pre-stored path-selection criteria to determine the subsequent path to be followed through the second model.

Preferably, the step of generating and storing a set of second network models is repeated to provide simulations of a plurality of different sets of user interaction sessions, the step of simulating the user interface including the selection of one of said sets of second network models from which to call up the second network model to be used upon a user-interaction element being encountered during progress through said first model.

To facilitate the simulation of various different types of output means, a library of simulations is advantageously provided, one parameter of each said set of parameters used to define a desired output state serving to indicate the relevant library simulation.

According to another aspect of the present invention, there is provided, in a program-controlled apparatus having input and output means for permitting user interaction sessions with an application program intended to be run or modelled on said apparatus, an arrangement for managing the user/program interaction comprising:

first network modelling means representing said program with each session of user interaction being indicated by a corresponding element of said first modelling means;

a set of second network modelling means each representing a respective one of said interaction sessions, each second network modelling means comprising a network of elements each having an associated set of parameters defining a desired state of said output means, control means arranged to utilise said first modelling means to control the actual or simulated running of the application program, said control means being operative upon encountering a said user-interaction element in the first modelling means, to refer to the appropriate one of said second network modelling means to control the said output means in executing a user interaction session, the said set of parameters associated with each said element of the second modelling means being used to set the output means in its desired state.

The program-controlled apparatus may be a computer workstation being used to model a user interface for an item of equipment, or it may be a piece of production equipment whose operation is managed by reference to network models.

BRIEF DESCRIPTION OF THE DRAWINGS

A user-interface design tool embodying the invention will now be particularly described, by way of non-limiting example, with reference to the accompanying drawings, in which.

DESCRIPTION OF THE PREFERRED EMBODIMENT

Figure 1:
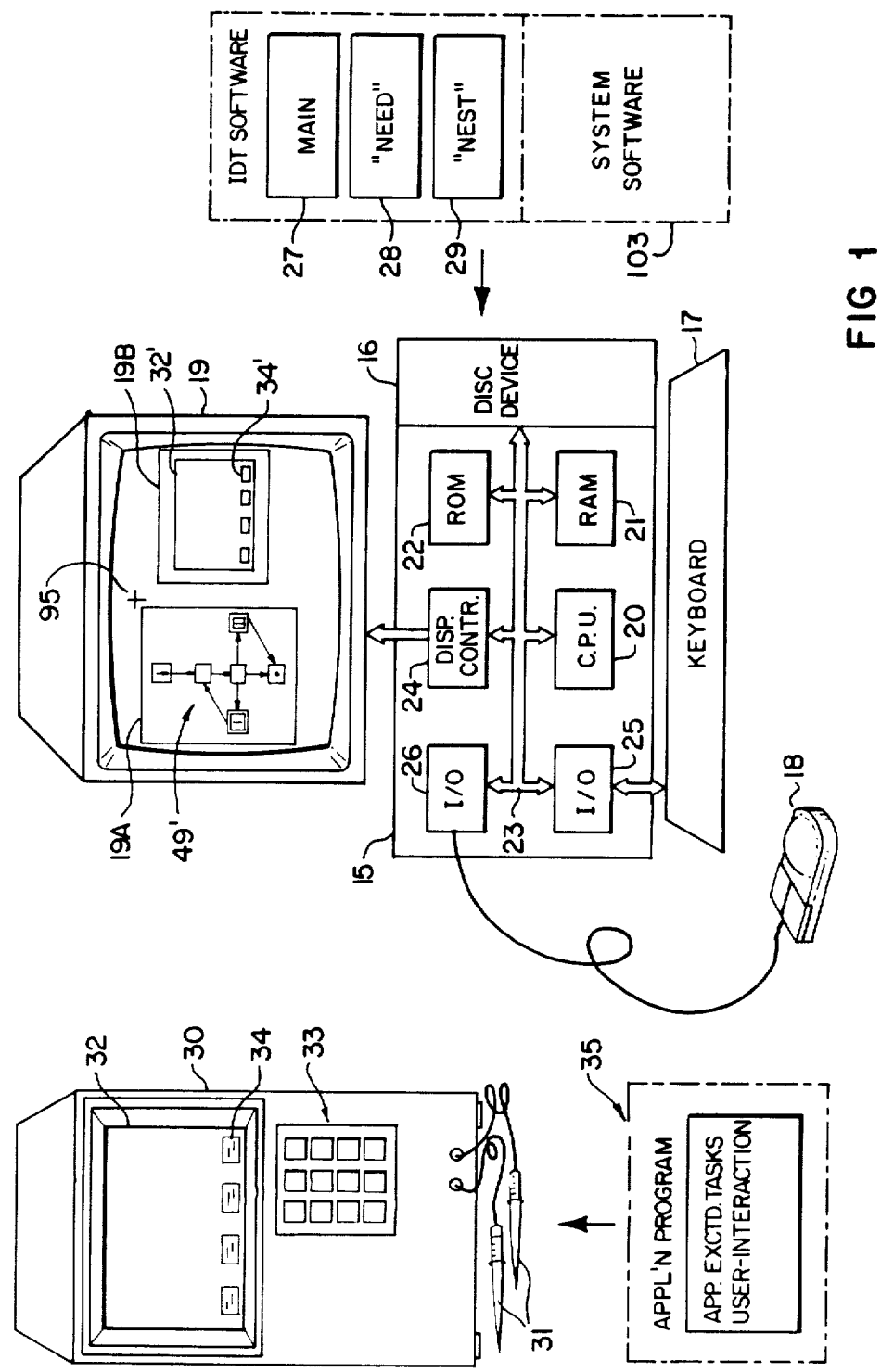
FIG. 1 is a diagrammatic representation of the hardware and software components both of the interface design tool itself and of an instrument for which a user interface is to be designed.

As shown in FIG. 1, the user-interface design tool now to be described comprises both hardware components and software components. The hardware components are the standard components of a computer workstation and comprise a processor box 15, a disc storage device 16, a first input device in the form of keyboard 17, a second input device in the form of a mouse 18, and a display unit 19.

Figure 3B:
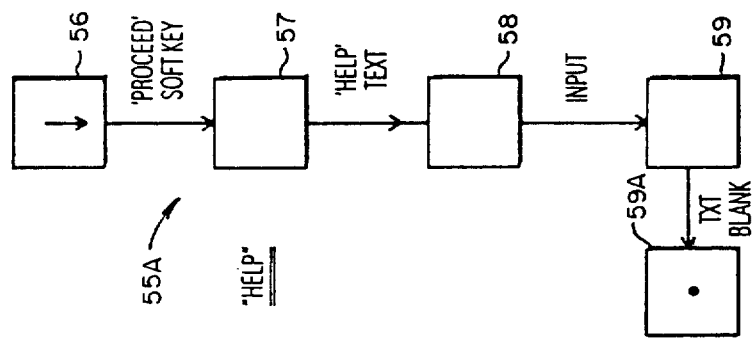
FIG. 3B is a dialogue network model of a menu mode user interaction session corresponding with the node 53 of FIG.3A.
Figure 3A:
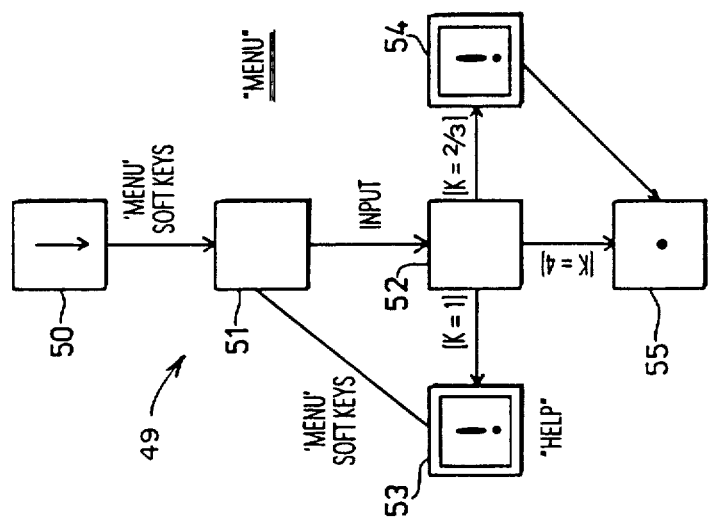
FIG. 3A is a dialogue network model of a top-level user interaction session corresponding with the node 41 of FIG. 2 that occurs during running of the instrument application program.

The display unit 19 is shown displaying two windows: a network window 19A and a simulation window 19B. However, it will be apparent that the display 19 is capable of displaying more or less than two windows as may be desired. The network window 19A is preferably utilized for displaying a representation of a network model; as shown in FIG. 1, the network window 19A is displaying a representation 49' of a network model 49, which network model is depicted in FIG. 3A and discussed in detail below. Similarly, the simulation window 19B is preferably utilized for displaying a representation of a physical device; as shown in FIG. 1, the window 19B is displaying a representation 32' of a touch screen 32 of an instrument 30. The representation 32' includes representations 34' of a plurality of softkeys 34 which are being displayed on the display 32 of the instrument 30, all as depicted elsewhere in FIG. 1 and discussed in detail below.

In standard manner, the processor box 15 comprises a central processing unit 20 interfacing via a bus system 23 with memory (namely, volatile RAM memory 21, non-volatile ROM memory 22 and the disc device 16) and also with the display unit 19 via a display controller 24, with the keyboard 17 via a first I/O controller 25, and with the mouse 18 via a second I/O controller 26.

The software components of the design tool comprise the interface design tool software itself (referred to below as the IDT software) and the usual system software providing facilities such as file management, screen handling (including windowing, icons, pulldown menus), and servicing of the keyboard and mouse input devices. The IDT software itself comprises three main elements, namely a main control program 27, a network editor program 28 (referred below as the NEED program) and a simulation program 29 (referred to as the NEST program).

In order to facilitate an understanding of the operation of the interface design tool, the following description of the tool is made with reference to the design of an interface for a hypothetical instrument 30 depicted in FIG. 1. This hypothetical instrument is intended to check whether a voltage or current measure at a specified test point is within predetermined limits, the results of this determination being output to the user. In hardware terms, the instrument comprises probes 31, circuitry (not shown) for executing the measurement and determination functions of the instrument, a user interface constituted by a touch screen 32 and an input keypad 33, and a microprocessor (not shown) for controlling the overall operation of the instrument. The touchscreen 32 is designed to receive user input via softkeys 34 and to output to the user by setting legends on the softkeys and by text line display on the rest of the screen. The microprocessor hardware controls the components of the instrument in accordance with an application program 35 which governs both the carrying out of instrumentexecuted tasks (such as voltage or current measurement) and the interaction of the instrument with the user via the interface hardware.

The interface design tool is to be used to design an instrument interface for the instrument 30, which interface, upon switching on the instrument 30, will present the user with the following four choices (via soft keys 34) with selection of a choice resulting in the indicated action:

(1) "HELP"- selection of this choice will bring up HELP text on the screen 32, the subsequent operation of a soft key labelled "Proceed" returning the user to the initial four-choice menu;

(2) "V MEASURE"- selection of this choice causes the instrument to ask for the input of a test point number (the instrument supposedly storing the acceptable range of values for each test point in memory); after a test point has been input the instrument carries out the required measurement and compares the result with the pre-stored range of acceptable values and then outputs an acceptable/unacceptable indication as text on the display 32. Return to the opening menu is effected by pressing a softkey labelled "Proceed";

(3) "I MEASURE"- selection of this choice results in a sequence of actions similar to that following selection of the previous choice except that a current rather than a voltage is measured;

(4) "EXIT"- selection of this choice shuts down the instrument after a check is made that all test points have been tested; if this is not the case, the user is asked to confirm that he wishes to shut down the instrument.

Figure 2:
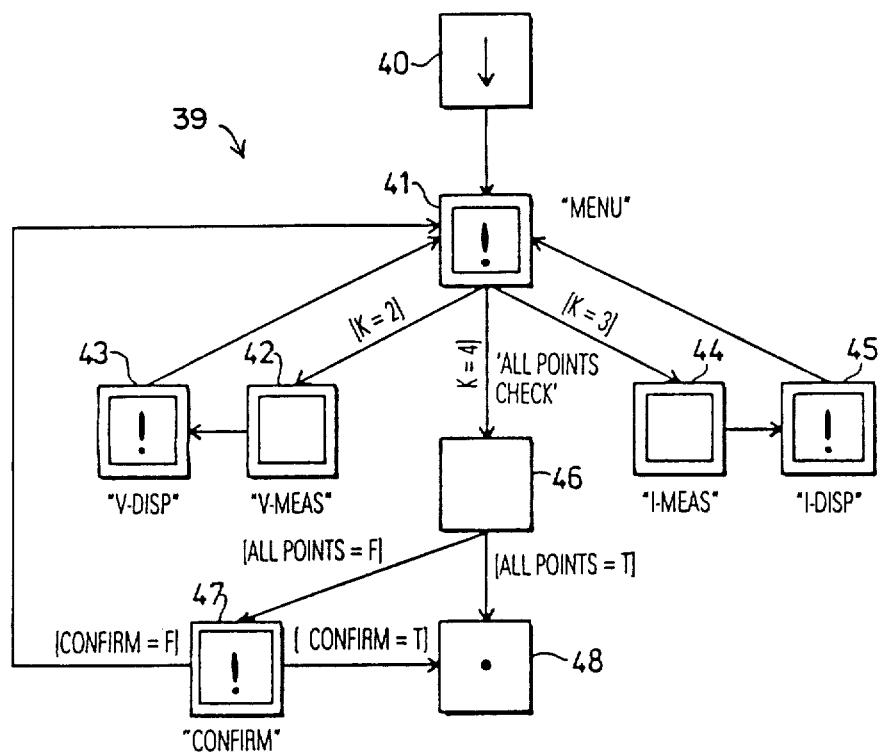
FIG. 2 is an augmented transition network modelling the application program intended to drive the instrument whose user-interface is to be designed.

The first step in designing a user-interface for the instrument is to model the operation of the instrument in terms of augmented transition networks with the instrument-executed tasks being modelled using a single application model that includes elements indicative of sessions of user interaction with the basic task-executing code; the sessions of user-interaction are themselves separately modelled by respective dialogue network models. An application network 39 modelling the functionality of the above-described hypothetical instrument is shown in FIG. 2. As can be seen, the basic components of this model 39 are nodes representing states of the instrument and depicted as square boxes in FIG. 2, and arcs representing actions and indicated by arrows in FIG. 2. Five types of nodes may be distinguished, as follows:

START NODE - this is the starting node of a network (see node 40 of FIG. 2);

END NODE - this is the finish node of a network model (see node 48);

APPLICATION SUBNET NODE - this node represents another network which forms a sub-network of the application model and is used to avoid any one network from becoming over complicated (see node 42 in FIG. 2);

COMMUNICATION NODE - this node indicates a point in the communication network where there is a session of user-interaction, this session being modelled by a dialogue network (see node 41);

SIMPLE NODE - the purpose of this node is to facilitate routing decisions through the network and the separation of actions (see node 46).

Figure 2A:
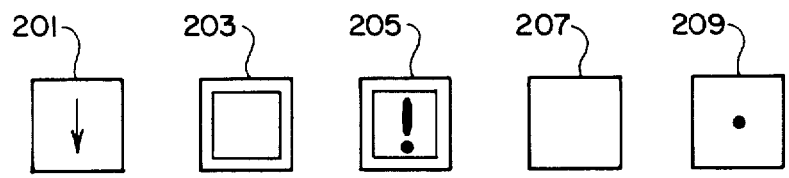
FIG. 2A is an illustration of a system of network model notation as used in the drawings herein.

FIG. 2A illustrates the symbols described above and used in the network models of FIGS. 2, 3A and 3B. Specifically, a rectangle 201 containing a downward-pointing arrow depicts a start node; a rectangle 203 containing another rectangle depicts an application subnet node; a rectangle 205 containing another rectangle which in turn contains an exclamation mark depicts a communication node; an empty rectangle 207 depicts a simple node; and a rectangle 209 containing a dot depicts an end or exit node.

As noted above, the application subnet nodes and the communication nodes refer to other networks. In FIG. 2, these networks are identified by names given in quotation marks beneath the referencing nodes.

Each arc of the network is defined by its starting and finishing node. Accordingly, in the following description the arcs will be referred to by combining the reference numerals of their starting and finishing nodes; thus, for example, the arc extending between nodes 40 and 41 will be referenced as arc 40/41. Each arc has an associated condition for entry to the arc from its starting node. In the drawings, this condition is given in square brackets on the arc concerned. An arc condition may be set to "unconditional" in which case no condition is indicated on the arc in the drawings. The action to be undertaken by the instrument on transition of the arc is indicated by the nonbracketed label associated with the arc; the absence of the label indicates the absence of an action.

Referring now in detail to the application model 39 of FIG. 2, the desired functionality of the instrument as described above is modelled as follows. Upon switching on the instrument (node 40), a user is presented with a menu of four choices and the further operation of the instrument depends on the user selection input received in response to presentation of the menu; this session of interaction with the user is indicated in the FIG. 2 application model by the communication node 41 labelled "MENU". Note that the arc 40/41 has no associated condition or action. To model the user selection input, a variable "k" is used, this variable having a value of 1, 2, 3 or 4 depending on whether the HELP, V MEASURE, I MEASURE, or EXIT OPTION is chosen. The HELP option merely involves an extension to the user-interaction session represented by the communications node 41. However, selection of any one of the other options involves instrument functionality which must be represented by an extension of the application model. The communication node 41 thus has three exit arcs 41/42, 41/44, and 41/46, the conditions on these arcs respectively being $K=2$, (the V MEASURE option), $K=3$ (I MEASURE option) and $K=4$ (EXIT option).

The selection of the V MEASURE option results in the instrument carrying out a voltage measurement and comparing the result with a stored range of acceptable values. This instrument-executed task involves a series of instrument actions which can be modelled by suitable network configuration; however, rather than including this network representation in the top-level application model shown in FIG. 2, for reasons of clarity this series of actions is best represented in an application sub-network indicated in the top level network by means of an application sub-network node (in the present case, node 42 labelled "V-MEAS"). Following the execution of the voltage measurement task and comparison of the result with the stored limits, the results of these tasks are displayed to the user; this display process is, of course, a user-interaction session and is represented in the application model by a communications node 43 labelled "V-DISP". The display process when terminated is then followed by a return to the selection menu; this is represented by arc 43/41 in the application.

Selection of the I MEASURE option results in instrument-executed current measurement tasks followed by a results display, this process being similar to that for voltage measurement. The current measurement process is represented in the application model by an application sub-network indicated by node 44 labelled "I-MEAS"; the user-interaction session by which the current measurement results are displayed is represented by the communications node 45 labelled "I-DISP".

The selection of the exit option from the menu results in one of two actions depending on whether or not all the test points that the instrument expects to be accessed have in reality been examined by the user. This check is indicated in the application model as an action carried out on the "$K=4$" arc exiting the communications node 41. In order to model the the subsequent decision process a simple node 46 is positioned at the end of the "$K=4$" arc and two exit arcs from the node 46 are provided leading to nodes 47 and 48 respectively. The node 48 is an exit node modelling shutdown of the instrument and the arc leading from node 46 to the exit node 48 carries a condition that a variable ALLPOINTS is true, this variable being set by the checking action on arc 41/46. The arc 46/47 carries the complementary condition of ALLPOINTS being false; in this case, a user-interaction session is initiated asking the user to confirm that he really does wish to shut down the instrument, the alternative being to return to the menu. Node 47 is thus a communications node (labelled "CONFIRM" in FIG. 2). The conditions on the two exit arcs from the node 47 relate to a variable CONFIRM derived from the user-interaction session modelled by the dialogue network associate with the communications node 47. When CONFIRM is true, the arc leading to the exit node 48 is taken; when CONFIRM is false, the arc leading to the "MENU" communications node 41 is taken.

It will be seen from FIG. 2 that the application model 39 modelling the instrument functionality includes four communication noes 41, 43, 45 and 47 representing four separate sessions of user-interaction. Each of these user-interaction sessions is modelled by a corresponding dialogue network model. By way of example, the dialogue model 49 of the user-interaction session represented by the "MENU" communications node 41 will now be described with reference to FIGS. 3A and 3B.

The elements of a dialogue model are the same as those used in an application model with the exception that application subnet nodes are, of course, not utilised in a dialogue model; it should however, be noted that hierachical structuring of dialogue models can still be achieved since the inclusion of a communication node in a dialogue model serves this purpose, such a node being a representation of a lower-level dialogue network model. FIG. 3A shows the top-level dialogue model 49 corresponding to the "MENU" communications node 41. This top-level dialogue model comprises a start node 50, two simple nodes 51, 52, two communication nodes 53, 54 an an exit node 55. The action of setting up the four softkeys for menu selection is ascribed to the arc 50/51. For reasons of simplicity, this action is separated from the subsequent action of getting a softkey input by the simple node 51, the setting of the softkey input being placed on arc 51/52. The user selection of one of the softkeys is taken as setting the variable k to a value of between 1 and 4. If the HELP softkey is selected (K=1) then HELP text is displayed on the screen together with a "Proceed" softkey which, when activated, returns the user to the selection menu. This series of actions is modelled by providing an exit arc 52/53 from the simple node 52 with a condition of the arc of K=1.

The node 53 is a communication node that references a dialogue model 55A describing the HELP session. As shown in FIG. 3B, the dialogue model 55A comprises a start node 56, three simple nodes 57, 58 and 59, and an exit node 59A. Setting up a "PROCEED" softkey is ascribed to the arc 56-57. Displaying the HELP text is ascribed to the arc 57-58. An input corresponding to activation of the "PROCEED" softkey is ascribed to the arc 58-59. Blanking the displayed HELP text and exiting the "HELP" dialogue, which result from activation of the "PROCEED" softkey, are ascribed to an arc 59-59A.

Following completion of the "HELP" dialogue model, an arc 53/51 is followed back to node 51, this arc carrying the action of setting up the menu softkeys.

If one of the measurement options is chosen via the menu softkeys (K=2 or 3) then the user is asked to input a number identifying the test point on which the measurement is to be made. This user-interaction is represented in FIG. 3A by the communications node 54 accessed via the arc 52/54. Once a test point reference number has been input, the "MENU" interaction session is terminated to enable the instrument to carry out necessary measurements; this is modelled by the arc leading from the node 54 to the exit node 55 of the FIG. 3A dialogue model.

User-selection of the exit softkey from the menu is modelled by the arc 52/55 leading from the simple node 52 to the exit node 55 and carrying condition of K=4.

Suitable network models for the application sub-networks represented by nodes 42, 44 and for the dialogue models represented by the communication nodes 43, 45, 47 and 54 will be apparent to persons skilled in the art on a reading of the foregoing description and will therefore not be described in detail hereinafter.

The operation of the present interface design tool takes place in two distinct phases. The first phase involves the construction, by interactive graphical techniques, of application and dialogue models of the form described with respect to FIGS. 2 and 3 together with the specification of variables to be used with the models and conditions and actions to be associated with the arcs of the models. The second phase involves the simulation of instrument user interface by stepping through the application and dialogue models and presenting on the display 19 of the computer workstation a simulation of the instrument interface as seen by the user at each stage and as defined by the appropriate actions associated with the arcs of the dialogue models. Before describing in detail the programs used to control these two phases of operation of interface design tool, it will be useful first to describe the data structures employed to store the application and dialogue models produced during the first phase and utilised during the second, simulation phase.

Figure 4:
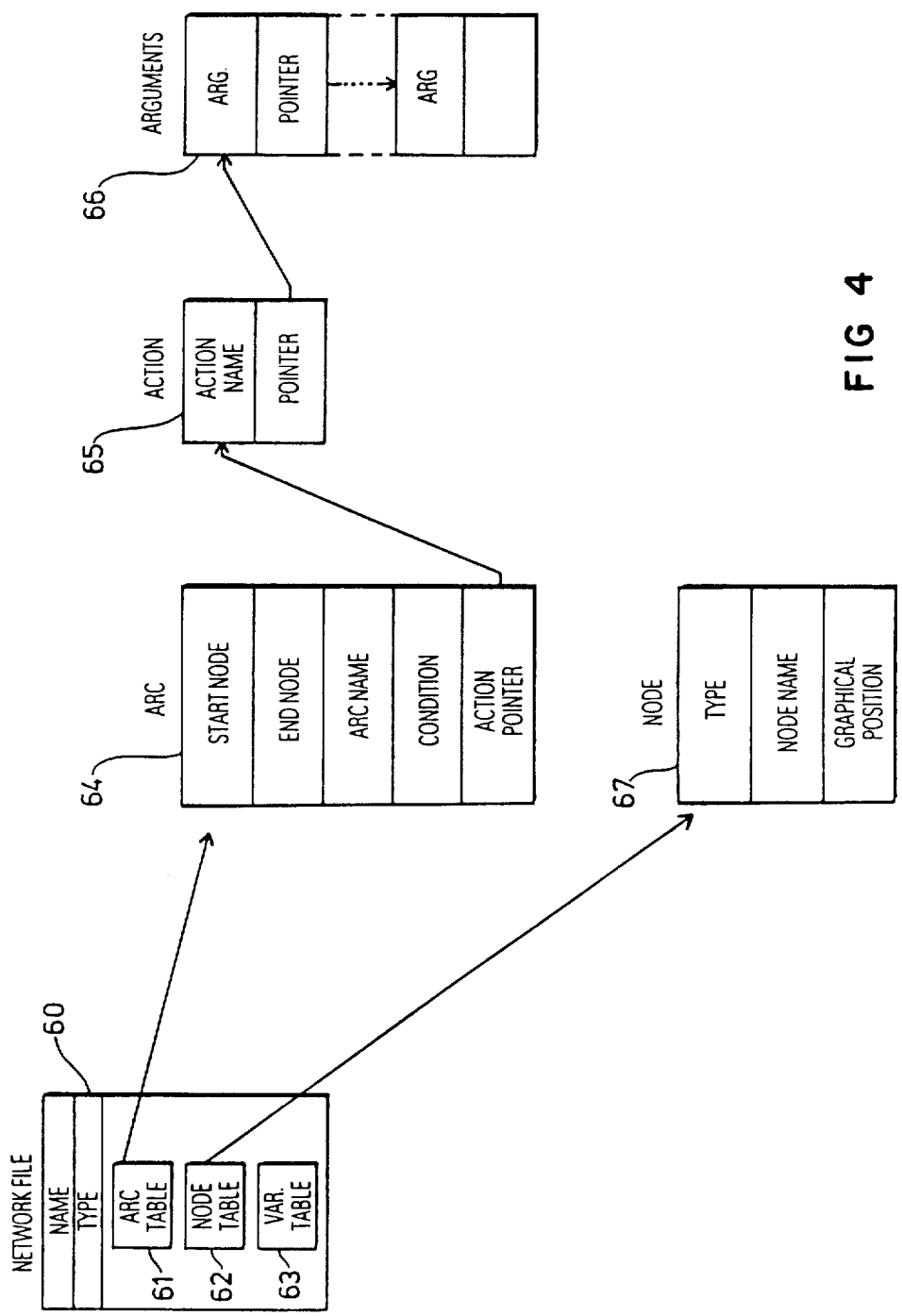
FIG. 4 is a diagram illustrating the data structures used by the interface design tool to store the network models of FIGS. 2 and 3.

Referring now to FIG. 4, the details of each network whether it be the top-level application model, an application sub-network model, or a dialogue model are stored in a respective network file 60. This network file 60 contains the network name by which the network and file are identified, the network type (application or dialogue), an arc table 61 containing details of each arc making up the network concerned, a node table 62 detailing the nodes of the network, and a variable table 63 listing the variables used in the network.

Each node in the node table 62 is detailed in a data structure 67 that contains the following items;

(1) An indication of the node type (start, end, simple, application subnet, or communication node);

(2) The name of the node;

(3) The graphical position of the node on the screen (the node screen position is related to a notional screen grid the intersections of which define potential centre points for the nodes, the node position being specified as a reference number associated with a particular grid intersection) notional screen grid referred to above.

Each arc in the arc table 61 is represented by a data structure 64 containing the following items:

(1) The identity of the arc starting node as represented by the number of that node in the node table;

(2) The identity of the arc end node as indicated by the node index in the node table;

(3) The name of the arc;

(4) The condition set on the arc, if any;

(5) A pointer to a data structure 65 identifying the action associated with the arc, if any.

The data structure 65 contains the name of the action to be taken and a pointer to a link list 66 of the arguments relating to the named action.

Figure 5:
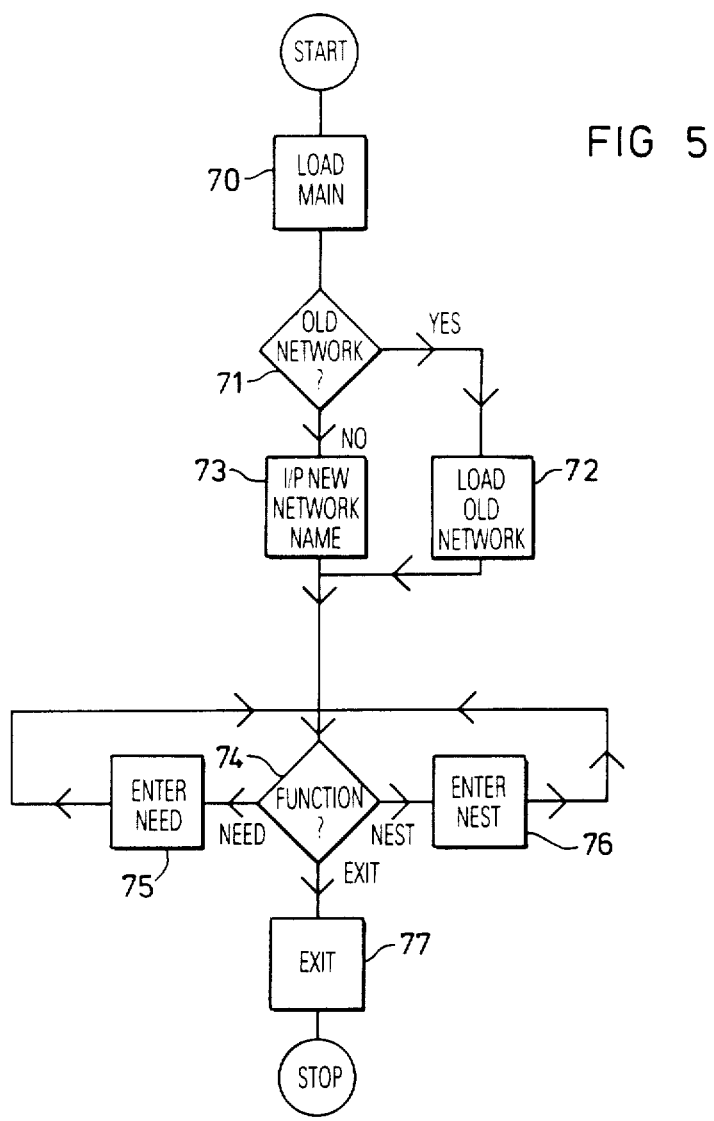
FIG. 5 is a flowchart of a main control program of the interface design tool software.

FIG. 5 is a flowchart of the main control program of the IDT software. This program basically controls migration between the network-editing phase and the network simulation phase.

Upon loading of the main program 27 (block 70 in FIG. 5) the user is first asked whether he wishes to work with an existing network model or to create a new one (block 71); in the former case the user inputs the name of the existing network and the corresponding network file is loaded into a working memory of the workstation (block 72) whereas in the latter case the user inputs the name of the new network model to be created and the main program opens a new file for that network (block 73).

Thereafter the user is asked whether he wishes to enter the network editor program NEED or the simulation program NEST or whether he wishes to exit the interface design tool package (see blocks 74 to 77). After completion of an editing or simulation session, the user is again given the opportunity to select the function he desires.

The functioning of the network editor program NEED will now be described with reference to FIG. 6. This program allows the graphical creation and editing of networks and, at the same time, takes care of the creation and editing of the data structures storing the network details.

On entering the NEED program (block 79A) the user is given the choice of selecting one of four functions (block 80), these functions being:

ADD

DELETE

COPY

MOVE

The ADD function enables the user to add new nodes and arcs to build or extend a network model and this function will now be described in more detail below.

After selection of the ADD function, the user is asked whether he wishes to add a node or an arc (block 81). If the user elects to add a node, a new entry is created in the node table 62 of the corresponding network file (block 78). Next, the user selects the type of node required (block 82). If the user elects to add a start node, the program assumes that a new network is being created and will at this stage ask the user to define what variables he wishes to use in the network (blocks 83, 84); the variable definitions are stored in the variable table 63 of the network file.

The user now proceeds to identify the screen position where he wishes the new node to be located; advantageously this is achieved using the mouse 18 to position the screen cursor 95 (see FIG. 1) and then to indicate to the program when the cursor is in the desired position. The node centre position is then located at the nearest intersection point of the notional screen grid mentioned above and the system graphics software is used to draw a node centered at this location (see blocks 85, 86). The grid intersection number is stored in the corresponding node data structure 67 (see block 87). The user is then asked to name the node and this name is also stored in the node data structure 67. Thereafter, the program returns to the function-select block 80.

If, after selection of the ADD function, the user elects to add an arc to the current network, then the program creates a new entry in the arc table 61 (block 79). The user then proceeds to define the arc by using the mouse 18 to point the cursor 95 to the start and end nodes of the arc (block 89). This information is used by the program to cause the system graphics software to draw an arc on the screen between the indicated nodes (block 90); at the same time, the node-table indexes of the starting and end nodes are entered into the corresponding entry in the arc table (block 91). The user is then asked for the name of the arc (block 92) following which the user can define any conditions and actions on the arc (blocks 93, 94) all of this information being entered into the corresponding arc-table entry.

Using the ADD function a desired network can be graphically constructed on the display screen 19 with the defining information on the network being stored in the various data structures of the corresponding network file. The other selectable functions (Delete, Move, and Copy) facilitate the editing of a network; the detailed operation of these functions will not be described herein as such operation will be apparent to persons skilled in the art.

Figure 6:
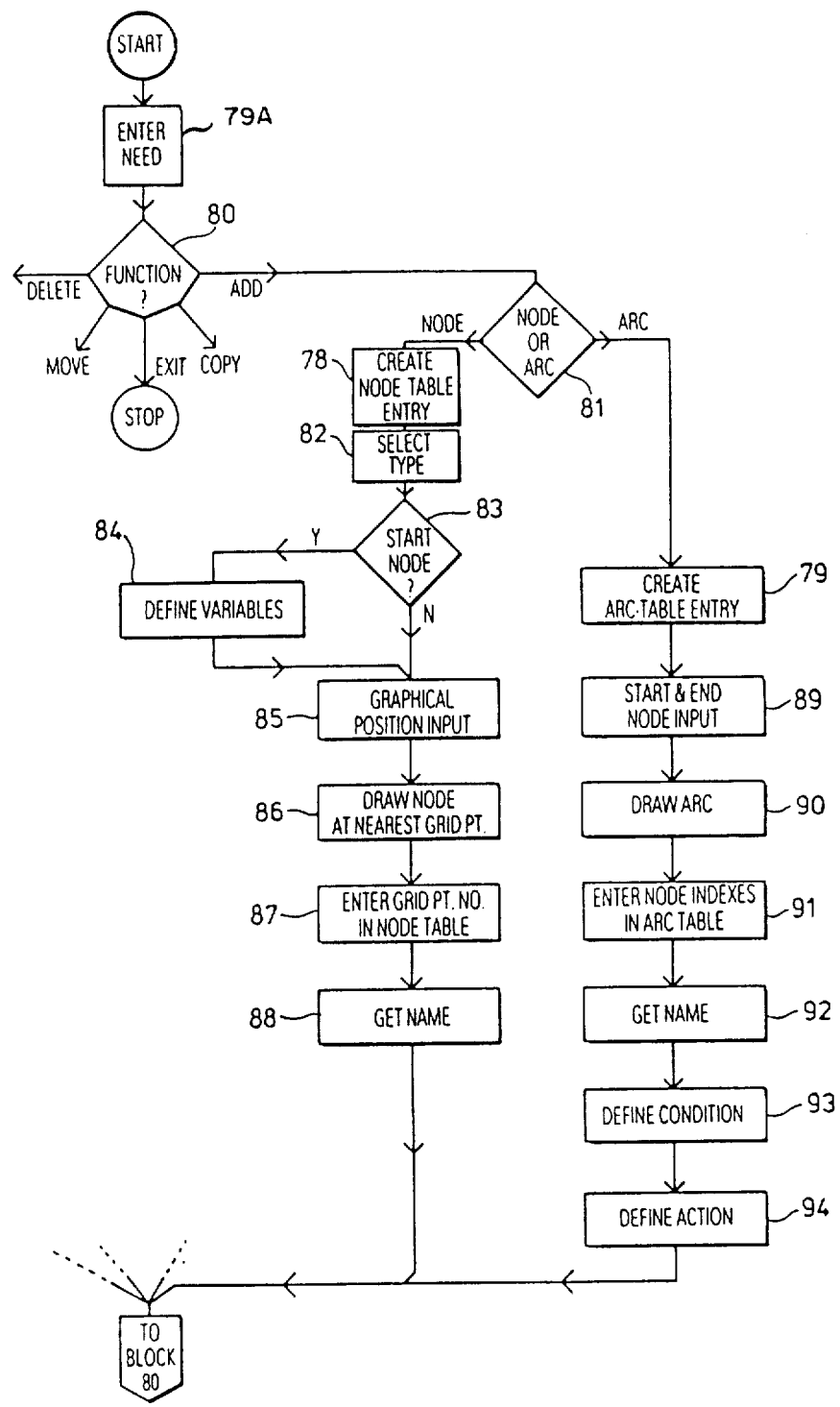
FIG. 6 is a flowchart showing part of a network editor program of the design tool software.

In FIG. 6, the operations of defining the variables, arc conditions and arc actions are indicated as occurring at the time of node and arc creation. In practice, a user may find it more convenient to first construct his desired network model as quickly as possible without having to define the variables, conditions and actions, these latter being added later. In order to facilitate this approach, these operations may be accessed directly from the function choice block 80, the appropriate definitions being then added once the arc or node of interest has been identified.

It should be noted that it is not, in fact, necessary to define all variables, conditions and actions in order to run a minimum simulation of a user interface under design, all that is necessary is to define the dialogue-network arc actions that control the interface. With this information a simulation may be run by "walking through" the network models and simulating on the display screen 19 the user interface as defined by dialogue network arc actions. In this "walk through" mode of simulation the path taken through a network must be specified by the user since without defining variables and conditions the network models cannot simulate the functionality of the instrument application program.

However, a fuller simulation can be achieved if variables and conditions are defined as this enables the user to converse with the simulation, the paths taken through the network models being then made dependent on user input to the simulation. This simulation mode is referred to as the "prototype" mode.

A full simulation of the instrument's functionality can be achieved by defining actions on the application network arcs that correspond to the tasks carried out by the instrument.

The definition of the dialogue-network actions take the form of action names that refer to library routines for simulating particular interface types. Furthermore, each action will generally have one or more associated arguments defining the detailed implementation required of a specified interface type. Thus, for example, in the present example it is desired to simulate an instrument in which the interface output involves use of softkeys and use of text output. This can be achieved by provided two library routines, one for defining softkeys and one for creating text output. The arguments of the softkey action call may, for example, be the number of softkeys required and the softkey legends; the arguments for text line action may be the desired text and the screen coordinates for where the text is to appear.

A similar library of routines may be used to define the arc actions of the application network model. However, generally these routines will be dummy routines rather than ones actually following the instrument functionality in every detail.

In the present interface design example for the instrument 30 of FIG. 1, dummy routines may be provided to simulate the application tasks of voltage measurement (part of the V-MEAS sub-network) current measurement (part of the I-MEAS sub-network) and the ALL-POINTS check on 41/46.

Figure 7:
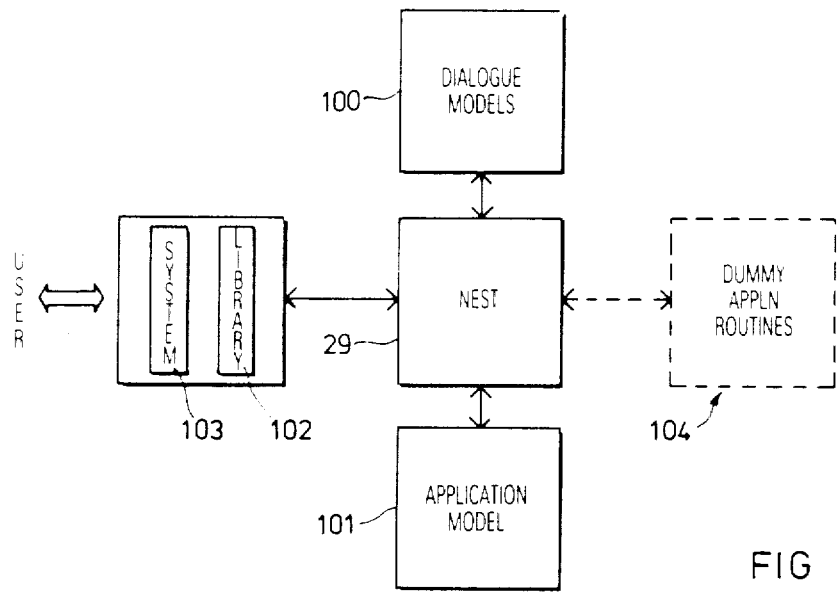
FIG. 7 is a diagram showing the functional relationship of a simulation program of the design tool software with other software components of the tool.

To run a simulation, the NEST program is first loaded together with the starting network for the simulation (this may be either the top-level application network if a simulation of the whole interface is required, or some other network if only a simulation of part of the interface is to be effected). As illustrated in FIG. 7, the simulation program NEST then carries out a simulation by utilising the application and dialogue models concerned (100 and 101), the library of interface action routines 102, the system software 103, and the library of dummy instrument-task routines 104.

Figure 9:
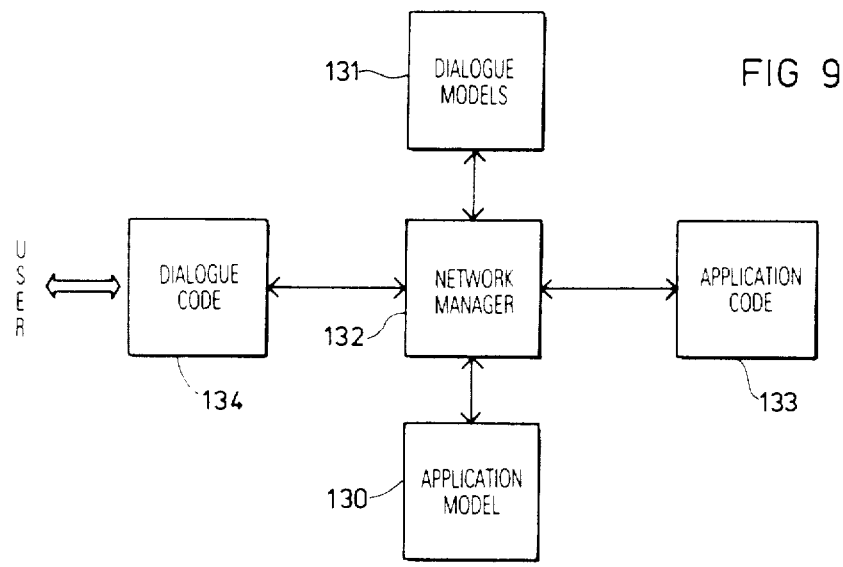
FIG. 9 is a diagram representing the functional interrelationship of the various software components of an instrument whose user-interface is managed in accordance with the present invention.
Figure 8:
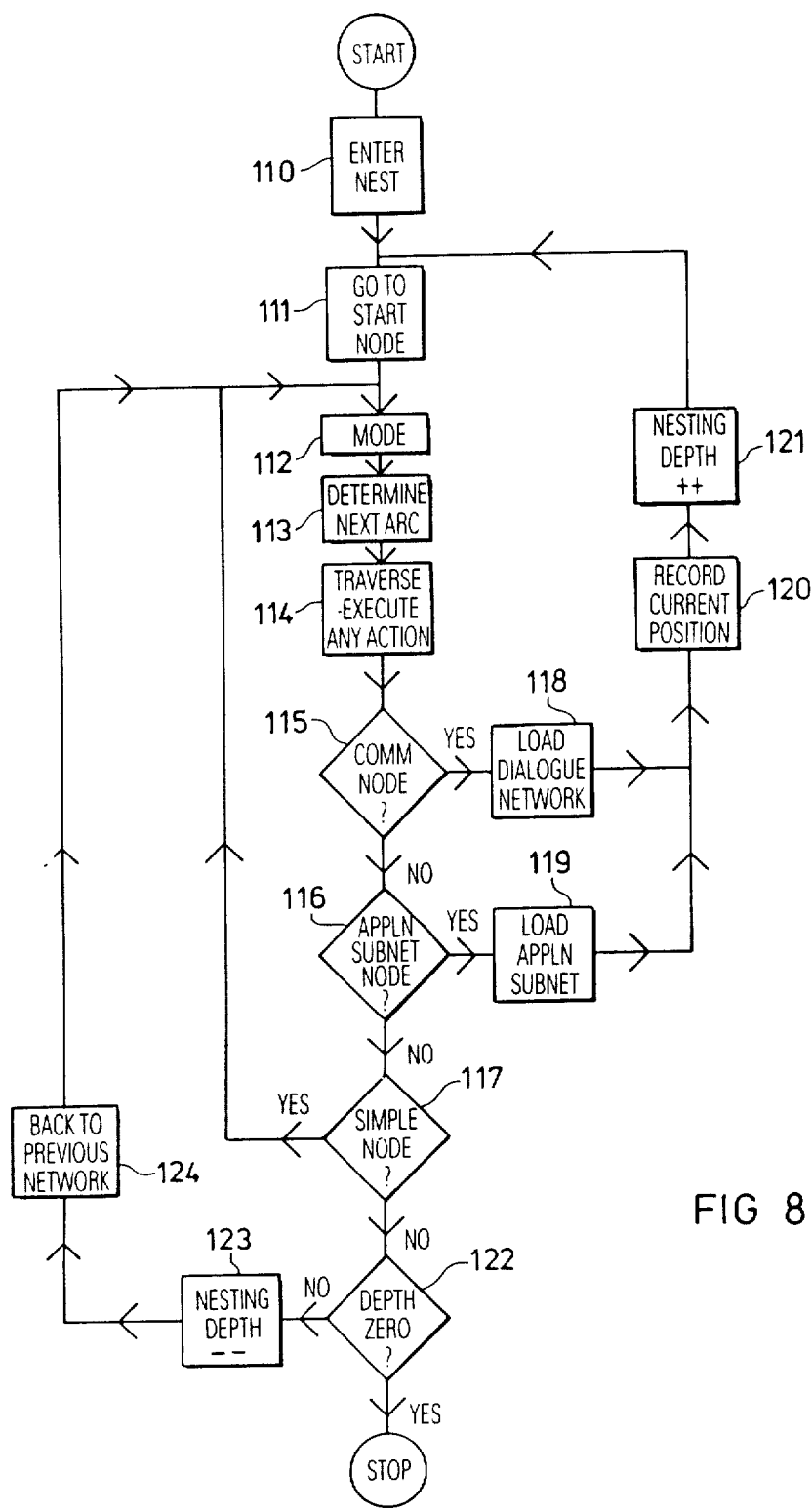
FIG. 8 is a flowchart of the simulation program.

The operation of the simulation program NEST will now be described in detail with reference to the flowchart of FIG. 9. On loading of the program, the display screen 19 is split into a network window 19A for displaying the selected network and a simulation window 19B for displaying the user interface simulation (these actions are embodied in block 110 of FIG. 8).

The simulation program establishes a current position for the simulation and at the start of a simulation this will be the starting node of the current network (block 111); this "current position" is indicated to the user by highlighting of the appropriate network node.

To progress through the network and thereby run a simulation, the user first selects whether he wishes to carry out the simulation in the "walk through" or "prototype" mode (block 112). The mode selected remains set until changed.

The program then proceeds to identify the arc next to be traversed (block 113). The manner of this identification will depend on the simulation mode selected. In the case of the "walkthrough" mode, the next arc to be traversed is indicated by pointing to the terminating node of that arc using the mouse 18. If the prototype mode has been selected then the arc next to be traversed will depend on the conditions on the arc and the current states of the simulation variables as set by user input and simulated instrument-executed tasks. Once the arc to be followed has been identified, the program traverses the arc and executes any action of the arc (block 114). As already indicated, the execution of an action will involved reference either to the library of application routines 104 if the current model is an application model, or to the library of interface routines 102 if the current model is a dialogue model. Where a dialogue-network arc action specifies a user-interface simulation, this simulation is displayed in simulation window.

Having traversed an arc, the "current position" is updated to that of the arc-end node with the latter being illuminated in the network window 19A. Thereafter the node type is examined (blocks 115, 116 and 117) and appropriate action taken. If the node is a communications node or an application sub-network node then the corresponding dialogue network or application sub-network is automatically loaded (blocks 118, 119) and replaces the parent network in the network window 19A. In order to keep track of this nesting of networks, the program both records the last "current position" in the parent network and also keeps account of the nesting depth (blocks 120 and 121). Once the new network has been loaded and the nesting housekeeping operations have been performed, the program loops back to block 111 to continue the simulation by starting at the start node of the new network.

If the arc-end node is a simple node rather than a communications or subnet node then the program loops back to block 112 for mode selection and determination of the next arc to be traversed.

If the arc-end node is not a communications, a subnet node, or a simple node, it is assumed to be an end node in which case the program checks the current nesting depth to see if the network just completed was the top-level one for the current simulation. If the nesting depth is zero (block 122), then the simulation program is terminated. On the other hand, if the nesting depth is not zero the next level network is reloaded and displayed in the network window 19A; at the same time, the nesting depth is updated and the "current position" is indicated in accordance with the stored position for the new network (see blocks 123 and 124). The simulation program then loops back to block 112.

By way of example, consideration will now given to running a simulation of the networks of FIGS. 2 and 3. Assuming that initially the application model network 39 of FIG. 2 is loaded, then initially this network will be displayed in the network window 19A with its starting node highlighted. The simulation window 19B will be blank.

If the walkthrough mode is selected, the simulation is progressed by the user using the mouse 18 to indicate in the network window 19A, node 41 thereby defining the arc 40/41 as the next arc to be traversed. This arc is then traversed but no action is executed as none has been specified on the arc. The current position is then advanced to node 41.

Since node 41 is a communications node, the simulation program proceeds to load the corresponding dialogue network, this being the MENU dialogue network 49 depicted in FIG. 3A. A representation 49' of the network 49 is displayed in the network window 19A as is illustrated in FIG. 1. The new current position is node 50 of the dialogue model. Walkthrough then continues with the arc 50/51 being traversed. This results in the execution of an action for setting up soft keys with the arguments of the action being four softkeys with the menu selection choices ascribed to these keys. In order to execute the action, the simulation program refers to the library of interface routines and selects the softkey routine therefrom; this routine together with the arguments stored in the node table entry for the node 51 result in a simulation or representation 32' of the instrument display 32 appearing in the simulation window 19B (as illustrated in FIG. 1). Once this action is completed the current position is moved on to node 51 with the latter being highlighted in the network window.

The simulation is then progressed by the user pointing to node 52 to cause arc 51/52 to be traversed, the action on this arc being the setting of the simulation to receive an input by simulated operation of the simulated softkeys using the mouse 18 and cursor 95. The current position is advanced to node 52.

From node 52 there are three possible exit arcs each carrying its own condition. While the simulation remains in walkthrough mode, the input action set up on traversing arc 51/52 and the conditions set on the arc exiting node 52 are not relevant since the exit from node 52 is defined by the user by selection of the next node in the network window. Thus, for example, the user may select node 53 which causes the representation 49' of the MENU dialogue network 49 to be replaced in the network window 19A by a representation of the HELP dialogue network 55A depicted in FIG. 3B. In this case, the display in the simulation window 19B does in fact remain the same until walkthrough of the HELP dialogue network 55A is carried out, at which time the depictions 34' of the four softkeys 34 are replaced in the simulation window 19B by a depiction of a single softkey labelled "PROCEED" and of the HELP text which would be displayed on the screen 32 of the instrument 30 contemporaneously with the "PROCEED" softkey.

Further description of the operation program in its walkthrough mode will not be given as such further operation will be apparent to persons skilled in the art.

Consideration will now be given to running of the simulation program in its "prototype" mode. In this case, the path followed through a network is determined by user input to the interface simulation displayed in the simulation window and by the conditions set on the network arcs.

Assuming the prototype mode is selected immediately following loading of the application model 39 of FIG. 2, the program will run the simulation through to node 52 of the FIG. 3A dialogue network 49 automatically and there wait for the condition of one of the exit arcs from this node to be satisfied before proceeding further. This automatic progression through the networks from the network 39 to the network 49 and within the network 49 to node 52 is advantageously arranged to take place on a step by step basis with a pause between each step so that the user can follow the progression of the simulation.

In order to satisfy a condition of one of the exit arcs from node 52, the user must simulate operation of one of the softkeys 34' in the simulation window 19B by pointing to that key using the mouse 18. This action sets a value of 1 to 4 to a variable K defined in the variable table of the network file of the MENU dialogue model 49. This variable is global inasmuch it is not only used in the MENU dialogue model but also in the first-level application model 39.

If, for example, the simulated "exit" softkey is chosen, a value of four is ascribed to the variable K with the result that the condition on arc 52/55 is satisfied and this arc is traversed by the simulation program. On reaching the exit node 55, the simulation program departs the MENU dialogue network 49 and returns to the application network 39; the representation 49' of the network 49 is removed from the network window 19A and a representation of the network 39 is once again displayed in the network window 19A. The display 32' in the simulation window 19B remains set at the menu softkey simulation.

The "current position" in the application network 39 upon reloading of the latter is the node 41. This node has three exit arcs with conditions on these arcs based on the variable K. In the present case, with K=4, the simulation automatically exits node 41 and traverses the arc 41/46 to node 46. The action associated with this arc is the check that all test points have been accessed; this action may or may not be modelled in the simulation. If the action is not modelled then the user must revert to the walkthrough mode in order to specify the exit arc desired from node 46. However, the action may be modelled either by the dummy routine or by a full routine. The dummy routine may, for example, be arranged to alternate between indicating that all points have been checked and the converse, this indication being by way of a variable ALLPOINTS defined in the variable table of the network file of the application model.

If a dummy or actual routine is provided for the ALLPOINTS check action and this routine returns the variable ALLPOINTS then, once the action has been completed, the simulation will exit the node 46 via the arc 46/47 or 46/48 in dependence on the state of the variable ALLPOINTS.

If the variable ALLPOINTS is set True, then the "current position" is set to the end node 48. However, if the variable ALLPOINTS is set False, then the CONFIRM dialogue network is loaded and displayed in the network window. This network is, for example, arranged to reset the softkeys to display two keys in the simulation window respectively labelled "CONFIRM" and "CANCEL". The simulated operation of these simulated keys is arranged to set a variable CONFIRM either true or false and return operation to the top-level application model. The state of the variable CONFIRM will then determine the exit arc followed from the node 47.

The further running of the simulation program in its prototype mode will be apparent to persons skilled in the art and is not therefore described herein.

From the foregoing it can be seen that the interface design tool permits the rapid modelling of the functionality and user-interface of an instrument or other program-controlled apparatus. Simulation of the actual user interface itself is then achieved by introducing appropriate actions on the arcs of the dialogue model (in the simplest case) and possibly also the introduction of actions and conditions on the arcs. The ability to be able to follow through the progress of the simulation both by reference to the network models in the network window and by reference to the simulation display in the simulation window greatly facilitates user interface evaluation. Furthermore, the division of the model of the instrument's functionality into an application model and a plurality of dialogue network models greatly eases the modification of the user interface design since such modification simply involves accessing the appropriate dialogue models rather than having to upset the underlying application model.

It will be appreciated that various modifications to the described interface design tool are possible. Thus, for example, when running the simulation program in its walkthrough mode, the indication of the network arc to be followed may be done more than one arc at a time by pointing to a node further through the network and arranging for the program to work out the route to that node; this of course, is only possible where the route is unambiguous. Another alternative is to allow the walkthrough process to progress automatically through the current network and only stop to await user guidance when a node with multiple exit arcs is encountered.

To assist the user in keeping track of the nesting of the application sub-networks and dialogue networks, provision can be made both during the network editing phase and the simulation phase, for displaying a list of currently-nested networks. In the editing phase, further provision may be made for transferring from the currently-displayed network to a selected one of the networks in the displayed nesting list.

The general approach described above for running the user interface simulation can, in fact, also be used to manage the operation of a program-controlled apparatus such as the instrument 30 subject of the above described simulation. Thus, with reference to FIG. 9, the operation of the apparatus could be modelled by means of application and dialogue models 130, 131 in the manner already described with progress through these models being managed by network manager 132 that functions in a manner similar to the NEST program 29. Where the application model 130 calls for an apparatus-executed task, this is implemented by the network manager 132 by calling up an appropriate block of application code 133. Similarly user-interface actions called for by the dialogue models 131 are implemented by the network manager 132 by calling up the appropriate dialogue code 134.

In order to accommodate users of varying degrees of proficiency, a plurality of sets of dialogue models can be provided each aimed at a particular level of user proficiency. The section of which set of dialogue models is used could be effected by the user himself or could be the subject of intelligent selection by the network manager based on past experience with the current user.

We claim:

1. A method of simulating a user interface for an apparatus, the apparatus including input and output means and a control program, the interface having a plurality of states, each state including at least one of a user-perceptible output provided by the output means and a user-selectable input receivable by the input means, the method comprising the steps of:
   generating and storing an application network model representing the control program, the model comprising a plurality of application elements, at least one such element depicting an apparatus function controlled by the program, each such function being depicted by one such element, and at least one such element depicting a user interaction session, each such session being depicted by one such element;
   generating and storing at least one dialogue network model, one such model representing each user interaction session, each dialogue model comprising at least one dialogue element, each such element having an associated interface parameter specifying a state of the user interface; and
   after generating and storing the models:
     advancing through the elements of the application model,
     upon encountering any element which depicts a user interaction session, branching to the dialogue model which represents said user interaction session and advancing through the elements of said dialogue model,
     using any interface parameter encountered while advancing through the elements of said dialogue model to simulate the state of the user interface specified by said parameter, and
     after advancing through the elements of said dialogue model, branching back to the application model and continuing to advance through the elements of the application model.

2. A method according to claim 1, wherein during advancement through a dialogue model an output means of a computer is used to display said dialogue model and any simulated state of the user interface.

3. A method according to claim 2, wherein the output means of the computer comprises a single display used to represent both the dialogue model and the simulation of the current state of the user interface.

4. A method according to claim 2, wherein the output means of the computer comprises respective display devices for representing both the dialogue model and the simulation of the current state of the user interface.

5. A method according to claim 1, wherein in order to represent a user interaction session the course of which is determined by user input during the session:
   the step of generating and storing a dialogue network model includes generating and storing a multi-path dialogue network model having more than one possible path therethrough to represent said user interaction session; and
   the step of using an interface parameter to stimulate a state of the user interface includes deciding which path to follow through the multi-path dialogue network according to an input provided by an operator.

6. A method according to claim 5 wherein the multi-path dialogue network has an associated criterion for deciding which path to follow and wherein deciding which path to follow comprises applying said criterion to the operator input.

7. A method according to claim 1, wherein in order to represent a program which has its path between apparatus-executed tasks determined by user input during a user interaction session:
   the step of generating and storing the application network model includes providing more than one possible path therethrough; and
   the step of using an interface parameter to simulate a state of the user interface includes deciding which path to follow through the application network according to an input provided by an operator.

8. A method according to claim 7, wherein the application network has an associated criterion for deciding which path to follow and wherein deciding which path to follow comprises applying said criterion to the operator input.

9. A method according to claim 1, wherein:
   the step of generating and storing a dialogue network model is performed a plurality of times to generate a plurality of different dialogue model representations of a user interaction session; and
   the step of branching to the dialogue model which represents said user interaction session comprises selecting one of the dialogue models which represents said user interaction session and branching to the selected model.

10. A method according to claim 1 and further comprising the step of generating a library of configurations of the output means, wherein each interface parameter specifies one of said configurations and the step of using an interface parameter to simulate a state of the user interface comprises accessing the library, retrieving therefrom the specified configuration, and using the retrieved configuration to simulate said state of the user interface.

11. A system for configuring a user interface in an apparatus, the apparatus including input and output means and a control program, the interface having a plurality of states, each state including at least one of a user-perceptible output provided by the output means and a user-selectable input receivable by the input means, the system comprising:
- an application network means representing the control program and comprising a plurality of application elements, at least one such element depicting an apparatus function controlled by the program, each such function being depicted by one such element, and at least one such element depicting a user interaction session, each such session being depicted by one such element;
- at least one dialogue network means, one such means representing each user interaction session, each dialogue means comprising at least one dialogue element, each dialogue element having an associated interface parameter specifying a state of the user interface; and
- control means operative
    - to advance through the elements of the application network means,
    - upon encountering an element which depicts a user interaction session, to branch to the dialogue network means which represents said user interaction session and to advance through the elements of said dialogue network means,
    - to use any interface parameter encountered while advancing through the elements of said dialogue network means to configure the user interface in accordance with said interface parameter, and
    - after advancing through the elements of said dialogue network means, to branch back to the application network means and continue to advance through the elements of the application network means.

12. A system according to claim 11 wherein:
- a dialogue network means which represents a user interaction session the course of which is determined by user input during the session has more than one possible path therethrough; and
- the control means selects a path through said network according to an input provided by the user.

13. A system according to claim 12 wherein the dialogue network means has an associated criterion for deciding which path to follow and wherein the control means selects a path by applying said criterion to the user input.

14. A system according to claim 11 wherein:
- the application network means has more than one possible path therethrough in order to represent an application program which has its path between apparatus-executed tasks determined by user input during a user interaction session; and
- the control means selects a path through said network according to an input provided by the user.

15. A system according to claim 14 wherein the application network means has an associated criterion for deciding which path to follow and wherein the control means selects a path by applying said criterion to the user input.

* * * * *

UNITED STATES PATENT AND TRADEMARK OFFICE
CERTIFICATE OF CORRECTION

PATENT NO. : 4,870,561

DATED : September 26, 1989

INVENTOR(S) : Simon Love; Elizabeth M. C. Boswell; Roger J. Quy

It is certified that error appears in the above-identified patent and that said Letters Patent is hereby corrected as shown below:

Abstract, line 16, "instrument interfaace" should read -- instrument interface --

Column 4, line 40, "of instrumentexecuted" should read -- of instrument-executed --

Column 7, line 11, "communication noes" should read -- communication nodes --

Signed and Sealed this

First Day of January, 1991

Attest:

HARRY F. MANBECK, JR.

Attesting Officer

Commissioner of Patents and Trademarks